United States Patent
Rudd et al.

(10) Patent No.: US 6,593,705 B1
(45) Date of Patent: Jul. 15, 2003

(54) RAPID-FIRING FLASHLAMP DISCHARGE CIRCUIT

(75) Inventors: Eric P. Rudd, Hopkins, MN (US); Carl E. Haugan, St. Paul, MN (US)

(73) Assignee: CyberOptics Corporation, Golden Valley, MN (US)

( * ) Notice: Subject to any disclaimer, the term of this patent is extended or adjusted under 35 U.S.C. 154(b) by 0 days.

(21) Appl. No.: 09/977,006

(22) Filed: Oct. 12, 2001

Related U.S. Application Data (60) Provisional application No. 60/175,049, filed on Jan. 7, 2000.

(51) Int. Cl.[7] ............................................... H05B 37/00

(52) U.S. Cl. ............................. 315/241 R; 315/241 S; 315/241 P; 315/200 A (58) Field of Search ......................... 315/241 P, 241 S, 315/241 R, 200 A (56) References Cited

U.S. PATENT DOCUMENTS

| | | | |
|---|---|---|---|
| 2,625,856 A | 1/1953 | Muller | |
| 3,648,181 A | 3/1972 | Fiore et al. | 328/59 |
| 3,678,362 A | 7/1972 | Amberger et al. | 320/1 |
| 3,777,061 A | 12/1973 | Takemura | 178/5.4 R |
| 3,792,309 A | 2/1974 | McDonald | 315/200 A |
| 3,930,184 A | 12/1975 | Biber et al. | 315/241 P |
| 3,953,763 A | 4/1976 | Herrick | 315/262 |
| 3,973,168 A | 8/1976 | Kearsley | 315/232 |
| 3,995,107 A | 11/1976 | Woywood | 178/7.1 |
| 4,007,399 A | 2/1977 | White | 315/241 R |

(List continued on next page.)

FOREIGN PATENT DOCUMENTS

| | | |
|---|---|---|
| DE | 40 11 407 A1 | 10/1991 |
| DE | 42 02 836 A1 | 8/1993 |
| DE | 19 511 160 A1 | 3/1995 |
| EP | 0 453 977 A2 | 10/1991 |
| EP | 0660 078 A1 | 12/1994 |
| GB | 2 007 047 A | 5/1979 |
| WO | WO 98/59490 | 6/1998 |
| WO | WO 99/12001 | 3/1999 |
| WO | WO 99/24786 | 5/1999 |
| WO | WO 0106210 A1 | 1/2001 |
| WO | WO 01/50760 A1 | 7/2001 |
| WO | WO 0154068 A2 | 7/2001 |
| WO | WO 02/01209 A1 | 1/2002 |
| WO | WO 02/01210 A1 | 1/2002 |

OTHER PUBLICATIONS

U.S. patent application Ser. No. 09/522,519, Skunes et al., filed Mar. 10, 2000, Pending.

U.S. patent application Ser. No. 09/524,133, Fishbaine et al., filed Mar. 10, 2000, Pending.

U.S. patent application Ser. No. 09/754,991, Kranz et al., filed Jan. 5, 2001, Pending.

(List continued on next page.)

Primary Examiner—David Vu
(74) Attorney, Agent, or Firm—Westman, Champlin & Kelly, P.A.

(57) ABSTRACT

A flashlamp circuit includes a charge reservoir that receives a first voltage from an external source. The charge reservoir is coupled to a resonator and a plurality of discharge capacitors to provide a second voltage to the plurality of discharge capacitors that is greater than the first voltage. A switch is disposed between at least one of the discharge capacitors and ground to selectively charge the at least one discharge capacitor based upon an input to the switch. Discharge energy is passed from the discharge capacitor(s) to a flashlamp through a discharge bank without passing through any inductive elements. A bleeder circuit can be interposed between the power supply and the reservoir to discharge the reservoir upon shutdown.

14 Claims, 3 Drawing Sheets

U.S. PATENT DOCUMENTS

| | | | |
|---|---|---|---|
| 4,139,805 A | 2/1979 | Cosco et al. | 315/241 R |
| 4,185,232 A | 1/1980 | Ingalls et al. | 315/241 R |
| 4,255,046 A | 3/1981 | Corona | 355/68 |
| 4,467,248 A | 8/1984 | Watanabe et al. | 315/241 P |
| 4,477,796 A | 10/1984 | Kearsley | 340/105 |
| 4,598,321 A | 7/1986 | Elabd et al. | 358/213 |
| 4,641,972 A | 2/1987 | Halioua et al. | 356/376 |
| 4,643,565 A | 2/1987 | Goto | 356/24 |
| 4,677,473 A | 6/1987 | Okamoto et al. | 358/101 |
| 4,742,277 A | 5/1988 | Shibuya et al. | 315/176 |
| 4,782,394 A | 11/1988 | Hieda et al. | 358/213.19 |
| 4,835,616 A | 5/1989 | Morcom | 358/213.19 |
| 4,900,990 A | 2/1990 | Sikora | 315/241 P |
| 4,949,172 A | 8/1990 | Hunt et al. | 358/101 |
| 4,963,024 A | 10/1990 | Ulich | 356/342 |
| 4,984,893 A | 1/1991 | Lange | 356/376 |
| 5,039,868 A | 8/1991 | Kobayashi et al. | 250/572 |
| 5,051,665 A | 9/1991 | Garrison et al. | 315/287 |
| 5,069,548 A | 12/1991 | Boehnlein | 356/376 |
| 5,091,963 A | 2/1992 | Litt et al. | 382/8 |
| 5,103,105 A | 4/1992 | Ikegaya et al. | 250/561 |
| 5,121,033 A | 6/1992 | Kosich | 315/241 R |
| 5,135,308 A | 8/1992 | Kuchel | 356/376 |
| 5,140,228 A | 8/1992 | Biegel | 315/291 |
| 5,196,766 A | 3/1993 | Beggs | 315/241 R |
| 5,278,634 A | 1/1994 | Skunes et al. | 356/400 |
| 5,298,734 A | 3/1994 | Kokubo | 250/208.1 |
| 5,307,152 A | 4/1994 | Boehnlein et al. | 356/376 |
| 5,347,200 A | 9/1994 | De Nardis | 315/241 S |
| 5,386,180 A | 1/1995 | Nakajima et al. | 315/241 S |
| 5,406,372 A | 4/1995 | Vodanovic et al. | 356/394 |
| 5,424,552 A | 6/1995 | Tsuji et al. | 250/548 |
| 5,450,204 A | 9/1995 | Shigeyama et al. | 356/378 |
| 5,450,228 A | 9/1995 | Boardman et al. | 359/209 |
| 5,546,127 A | 8/1996 | Yamashita et al. | 348/297 |
| 5,636,025 A | 6/1997 | Bieman et al. | 356/374 |
| 5,646,733 A | 7/1997 | Bieman | 356/376 |
| 5,668,665 A | 9/1997 | Choate | 359/663 |
| 5,684,530 A | 11/1997 | White | 348/131 |
| 5,686,994 A | 11/1997 | Tokura | 356/394 |
| 5,691,784 A | 11/1997 | Häusler et al. | 349/1 |
| 5,708,532 A | 1/1998 | Wartmann | 359/663 |
| 5,761,337 A | 6/1998 | Nishimura et al. | 382/150 |
| 5,774,221 A | 6/1998 | Guerra | 356/376 |
| 5,815,275 A | 9/1998 | Svetkoff et al. | 356/376 |
| 5,867,604 A | 2/1999 | Ben-Levy et al. | 382/254 |
| 5,912,984 A | 6/1999 | Michael et al. | 382/149 |
| 5,953,448 A | 9/1999 | Liang | 382/154 |
| 5,969,819 A | 10/1999 | Wang | 356/371 |
| 5,982,927 A | 11/1999 | Koljonen | 382/168 |
| 5,991,461 A | 11/1999 | Schmucker et al. | 382/284 |
| 5,999,266 A | 12/1999 | Takahashi et al. | 356/376 |
| 6,011,359 A | 1/2000 | Days | 315/241 S |
| 6,061,476 A | 5/2000 | Nichani | 382/270 |
| 6,084,712 A | 7/2000 | Harding | 359/618 |
| 6,180,935 B1 | 1/2001 | Hoagland | 250/208.1 |
| 6,232,724 B1 | 5/2001 | Onimoto et al. | 315/161 |
| 6,268,923 B1 | 7/2001 | Michniewicz et al. | 356/512 |
| 6,269,197 B1 | 7/2001 | Wallack | 382/285 |
| 6,307,210 B1 | 10/2001 | Suzuki et al. | 250/559.08 |

OTHER PUBLICATIONS

Copy of International Search Report from Application No. PCT/US00/42760 with international filing date of Dec. 12, 2000.

Copy of International Search Report from Application No. PCT/US00/42764 with international filing date of Dec. 12, 2000.

Copy of International Search Report from Application No. PCT/US01/00330 with international filing date of May 1, 2001.

"Cognex and Sony Team Develops Machine–Vision Camera", *Vision Systems Design*, p. 15 (Feb. 1999).

"3–D Profilometry Based on Modulation Measurement", by Likun et al., vol. 19, No. 9, pp. 1–11 (Sep. 1999).

"High Frame Rate Cameras", *Princeton Instruments Catalog of High Performance Digital CCD Cameras*, 2 pages (Oct. 1994).

"Area Array CCD Image Sensor 1024×1024 Pixels with Antiblooming", CCD Products, Thomson–CSF Semiconducteurs Specifiques, pp. 267–273 (1996).

"Accurate Machine Vision s the 'Telecentric Advantage'", 3 pages from website.

"Rank Order Morphological Hit–Miss Transform and Its Optical Implementation", by Huiquan et al., ACTA OPTICA SINICA, vol. 19, No. 9, pp. 1256–1263 (Sep. 1999). Translation provided.

Nelms R.M. et al., "High Voltage Capacitor Charging Power Supplies for Repetitive Rate Loads," Conference Record of the Industry Applications Society Annual Meeting, vol. 2, pp. 1281–1285 (Oct. 7, 1990).

RAPID-FIRING FLASHLAMP DISCHARGE CIRCUIT

CROSS-REFERENCE TO RELATED APPLICATIONS

This application has related patented applications all owned by the same assignee as the present invention identified as follows: Ser. No. 09/522,519 filed Mar. 10, 2000 entitled "INSPECTION SYSTEM WITH VIBRATION RESISTANT VIDEO CAPTURE"; Ser. No. 09/754,991 filed Jan. 5, 2001 entitled "PHASE PROFILOMETRY SYSTEM WITH TELECENTRIC PROJECTOR"; Ser. No. 09/524,133 filed Mar. 10, 2000 entitled "SOLDER PASTE INSPECTION SYSTEM", which all claim priority to provisional application Serial No. 60/175,049, filed Jan. 7, 2000.

COPYRIGHT RESERVATION

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to optical image processing, and in particular to flashlamp circuits for stroboscopic illumination of objects.

BACKGROUND OF THE INVENTION

Modern digital computing technology is being called upon to perform an ever-increasing variety of tasks. Machines, which once responded purely to manual direction, are now being equipped with computer processors, enabling them to assist a human operator. Manufacturing lines, which produce volumes of standardized assemblies, are being equipped with computer-controlled process machinery. Industrial robots have the capability of being re-programmed to perform many different tasks within the mechanical limits of motion of the device.

The automated analysis of captured optical images has great utility for digital control systems. For example, optical imaging may be used to great advantage in automated manufacturing environments, although this is not necessarily the only possible application. Usually, the acquisition of optical images does not interfere with sensitive parts or manufacturing processes, as other forms of measurement might. Optical images of manufactured articles may be captured and analyzed for purposes of inspection, or for guiding the motion of process machinery, such as an industrial robot, relative to a workpiece.

In many applications, it is desirable to create a height image or profile of a target object, in order to produce a 2-dimensional map of surface heights. One particular example of this is the inspection of solder deposits on electronic printed circuit cards. As well appreciated by those knowledgeable in the industry, at an intermediate stage of manufacture, these cards may have hundreds or thousands of small solder deposits, which are electrically coupled to circuit paths printed within the card. When electrical components are later mounted on the card, the solder is melted to form electrical connections between the circuit paths in the card and pins, wires, or other conductors from the components. The increasing complexity of the information age demands that these components have larger and larger numbers of connections, usually within smaller and smaller areas. An insufficient amount of solder at a connection site may result in a failure to make the connection, or a connection that intermittently fails or fails after some time in the field. Excess solder or misplaced solder can similarly wreak havoc with the resulting product. The size and number of such connections places great demands on the consistency of the manufacturing process. It also makes it difficult to inspect a card for defects. At the same time, the cost of an undetected defect can be large. Accordingly, there is substantial potential benefit in an automated process, which can accurately inspect solder deposits quickly and without damage to the card. A height profile of a circuit card with solder deposits, taken from optical measurements, can be used to determine the volume of solder at each connection site.

One technique for generating a height profile of a target object from optical measurements is known as phase profilometry. In this technique, light illuminates the target object and at least two images of the target object are acquired, each image acquired either at different phases of light, or at differing positions of the target. In either event, a phase shift is introduced between any two of the images. The images are then combined by image processing techniques to reconstruct a height image. Various methods for phase profilometry are disclosed in U.S. Pat. Nos. 4,657,394, 4,641,972, 5,636,025, 5,646,733 and 6,049,384.

The technical problem of capturing at least two images of a target object is non-trivial. It is desirable to capture the images in rapid succession, in order to reduce misregistration caused by undesired motion between the different exposures, and support a high throughput of image capture and analysis. In particular, it is desirable to wait no more than 1 millisecond between any two successive image acquisitions to be combined. While it may be possible to generate successive images within approximately 1 millisecond or less using existing techniques, such techniques involve excessive power consumption and/or excessive hardware, or involve other undesirable side effects. For example, in the case of three-phase profilometry, it is possible to replicate three separate lamps, circuits, and associated hardware for acquiring three separate images, but this would involve considerable hardware expense, and would introduce additional variables if the illumination from different sources were not identical. Additionally, the peak power consumption for known circuits that discharge a single flashlamp with approximately 1 millisecond spacing is typically on the order of 200 watts, which is beyond the capabilities of known small high-voltage (HV) supplies.

Techniques have been proposed that reduce power consumption and/or excessive hardware by providing a resonant charging circuit that charges a discharge capacitor from a large reservoir capacitor. An example of such teaching is set forth in U.S. Pat. No. 3,953,763 to Herrick. The inherent dynamics of the circuit of Herrick allow the discharge capacitor to be charged to roughly twice the voltage of the reservoir capacitor. Such resonant charging is accomplished with low dissipation. While the circuit of Herrick provides a number of advantages, it is not without need for improvement. For example, aspects of the Herrick circuit are believed to have unduly shortened the lifetime of a tested flashlamp. The circuit of Herrick cannot be used without an inductor, because without adequate inductance in the circuit, the di/dt of the circuit would exceed the maximum allowable for most commercially available SCRs, causing SCR failure from internal hotspots. Here i denotes current and t denotes time. Addition of an inductor can relieve this problem, since the di/dt is limited to approximately v/L, where v is the discharge potential and L is the inductance. For typical SCRs, the di/dt limit of 200 A/μs, together with the 450-V discharge potential, indicates that an inductor of at least 2 μH is needed. This value of inductance significantly lengthens the tail of the discharge, which has the disadvantage of shortening lamp life. Although SCR devices are available with higher di/dt ratings than the usual 200 A/μs, they are expensive and prohibitively bulky.

Further, the circuit does not provide for a fast, convenient discharge of the reservoir capacitor for safety in handling and repairing the circuit. Finally, the circuit of Herrick does not provide selectable discharge energies. A rapid firing flashlamp discharge circuit providing resonant charging and addressing the limitations above thus provides a significant improvement.

SUMMARY OF THE INVENTION

A flashlamp circuit includes a charge reservoir that receives a first voltage from an external source. The charge reservoir is coupled to a resonator and a plurality of discharge capacitors to provide a second voltage to the plurality of discharge capacitors that is greater than the first voltage. A switch is disposed between at least one of the discharge capacitors and ground to selectively charge the at least one discharge capacitor based upon an input to the switch. Discharge energy is passed from the discharge capacitor(s) to a flashlamp through a discharge bank without passing through any inductive elements. A bleeder circuit can be interposed between the power supply and the reservoir to discharge the reservoir upon shutdown.

DETAILED DESCRIPTION OF THE PREFERRED EMBODIMENTS

Figure 1:
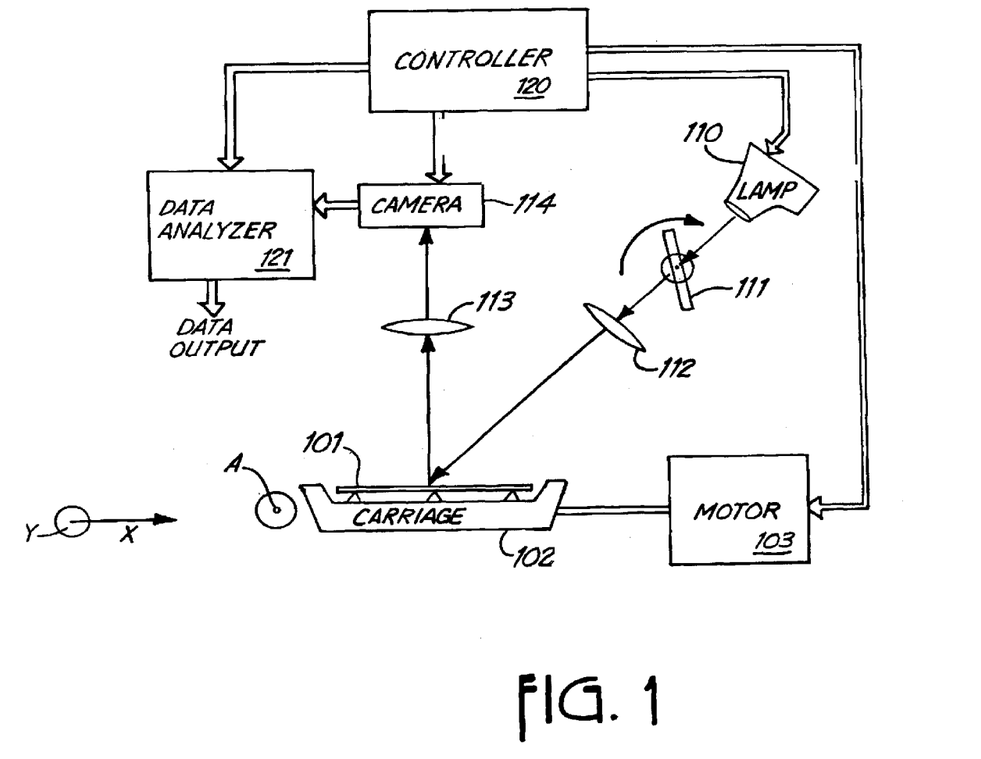
FIG. 1 is a diagrammatic view of an environment for utilizing a flashlamp apparatus in accordance with embodiments of the present invention.

FIG. 1 illustrates an environment for utilizing the flashlamp apparatus in accordance with the preferred embodiment of the present invention. In this embodiment, images of printed circuit cards are captured and analyzed as part of a printed circuit card inspection step in an electronic assembly manufacturing process, the analysis for evaluating the adequacy of solder paste deposits on the card by determining the height and volume of paste deposits. As shown in FIG. 1, a printed circuit card 101 to be inspected is mounted on a moveable carriage 102, the carriage being driven by electric motor 103. A pulse of light is generated by flashlamp 110, and directed through reticle 111 and source lens 112 to strike the surface of printed circuit card 101 at an angle. The reflected striped light is imaged by camera lens 113 on charge coupled device (CCD) array camera 114, which digitizes the reflected image. Digital images from camera 114 are transmitted to data analyzer 121 for analysis, specifically, for determination of the volume of solder paste deposits. Controller 120 controls the simultaneous operation of motor 103, flashlamp 110, camera 114, and data analyzer 121.

Reticle 111 structures the light passing through it into a sinusoidally varying intensity pattern. Reticle 111 has alternating areas of relatively dark and relatively clear stripes, which vary sinusoidally in opacity. The structured light is projected on card 101 at least 2 different times.

Carriage 103 moves in the plane of printed circuit card 101, i.e., perpendicular to the path of light into the camera. Since the height of circuit card features is being measured from the reflected light, it is important that carriage 102 maintain card 101 at a constant distance from camera 114 and lamp 110 although other systems where the invention finds use may operate otherwise, and are found outside the printed circuit card inspection business. Carriage 102 is capable of x-y motion, which permits inspection of any arbitrary region of card 101. However, for purposes of providing height information over a portion of the board in a single scan of the board, only one direction of motion is required; this should have a component perpendicular to the illumination stripes. For simplicity, FIG. 1 shows only a single motor 103, while in fact two motors may be used to move the card in 2 dimensions.

While in the preferred embodiment it is the card (i.e., the target object) which is moving, it will be appreciated that the same effect could be produced by moving the flashlamp, reticle, lenses and camera together (as by mounting these devices on a common moving carriage), while card 101 remains still. It is also possible to produce out-of-phase images by moving reticle 111.

Controller 120 controls the operation of the various devices as follows. Controller 120 causes motor 103 to position carriage 102 so that a region of interest on card 101 is within the field of view of lens 113 and camera 114. At a given position, controller 120 generates a series of at least two (preferably three) flashlamp discharge signals to flashlamp 110, each discharge associated with a distinct phase of the light, the signals being approximately 1 msec apart. Concurrently with the discharges of flashlamp 110, controller 120 causes camera 114 to capture three separate images, any one image corresponding to each discharge of the flashlamp. Camera 114 transmits these three separate images to data analyzer 121. Controller 120 causes analyzer 121 to store the images as received, and to analyze the height (and ultimately volume) of solder deposits in the region of interest on card 101. Typically, controller 120 will cause the apparatus to capture and analyze images in several different regions of interest on a single card.

While controller 120 and data analyzer 121 are illustrated as separate blocks in FIG. 1 for conceptual purposes, in fact these may be implemented as software functions executing on a programmable processor of a single general purpose digital computer system.

Further background information concerning the analysis of feature height in a target object from multiple out-of-phase images can be found in commonly assigned U.S. Pat. No. 6,049,384 filed Feb. 27, 1996, entitled "Method and Apparatus for Three Dimensional Imaging Using Multi-Phased Structured Light", which is herein incorporated by reference (using two separate lamp sources to produce two-phase images, which can be analyzed using certain simplifying assumptions).

Figure 2:
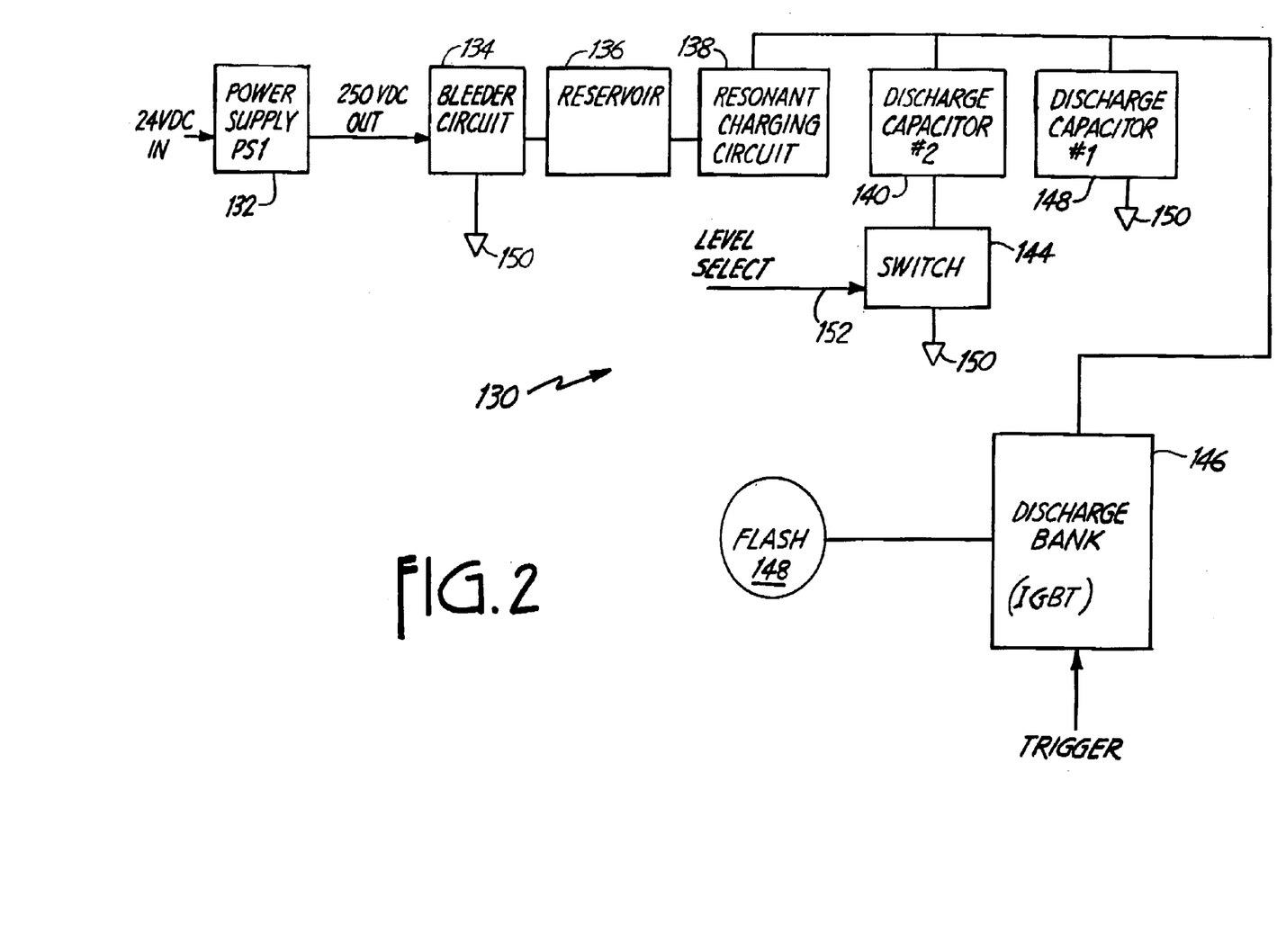
FIG. 2 is a system block diagram of a flashlamp discharge circuit in accordance with an embodiment of the present invention.

FIG. 2 is a system block diagram of a flashlamp discharge circuit in accordance with an embodiment of the present invention. Circuit 130 is preferably disposed within controller 120 illustrated in FIG. 1, but may reside in any suitable location. Circuit 130 includes bleeder circuit 134, reservoir 136, resonant charging circuit 138, discharge capacitors 140, 142, switch 144, discharge bank 146 and flashlamp 148. Bleeder circuit 134 is interposed between the input to reservoir 136 and ground 150. During normal operation bleeder circuit 134 simply allows charge to flow therethrough and accumulate within reservoir 136. However, when circuit 130 is shut down, or otherwise disabled, bleeder circuit 134 creates a current path from reservoir 136 to ground 150 thereby discharging reservoir 136.

Resonant charging circuit 138 is disposed between reservoir 136 and discharge capacitors 140, 142. Circuit 138 resonates between about 0 volts and about 500 volts for one-half cycle, at which time SCR opens and maintains the potential across the capacitor(s) 140, 142. As illustrated, circuit 130 preferably includes a plurality of discharge capacitors, such as capacitors 140, 142. When such a plurality of discharge capacitors are used, all but one of the capacitors have a switch, such as switch 144, disposed between it and ground 150 to thereby selectively determine whether the given discharge capacitor will be charged in a given charge cycle. While FIG. 2 illustrates a pair of discharge capacitors 140, 142, those skilled in the art will recognize that additional discharge capacitors could be provided to provide additional discharge energies. As illustrated, discharge capacitor 142 will always be charged during the charging cycle. However, discharge capacitor 140 will only be charged if switch 144 couples capacitor 140 to ground 150. Thus, the LEVEL SELECT 152 allows switching between energy levels.

When capacitor(s) 140, 142 are suitably charged, a TRIGGER signal provided to discharge bank 146 will provide the discharge energy from the discharge capacitor(s) to flashlamp 148. This will pulse flashlamp 148, which is preferably a model EG&G FX-1160 available from Perkins Elmer Optoelectronics, 44370 Christy St., Fremont, Calif. 94538. Those skilled in the art will notice that the discharge energies are conveyed from discharge capacitor(s) 140, 142 to lamp 148 without passing through an inductor. By not passing the discharge current through an inductor, the lifetime of flashlamp 148 is increased.

Figure 3:
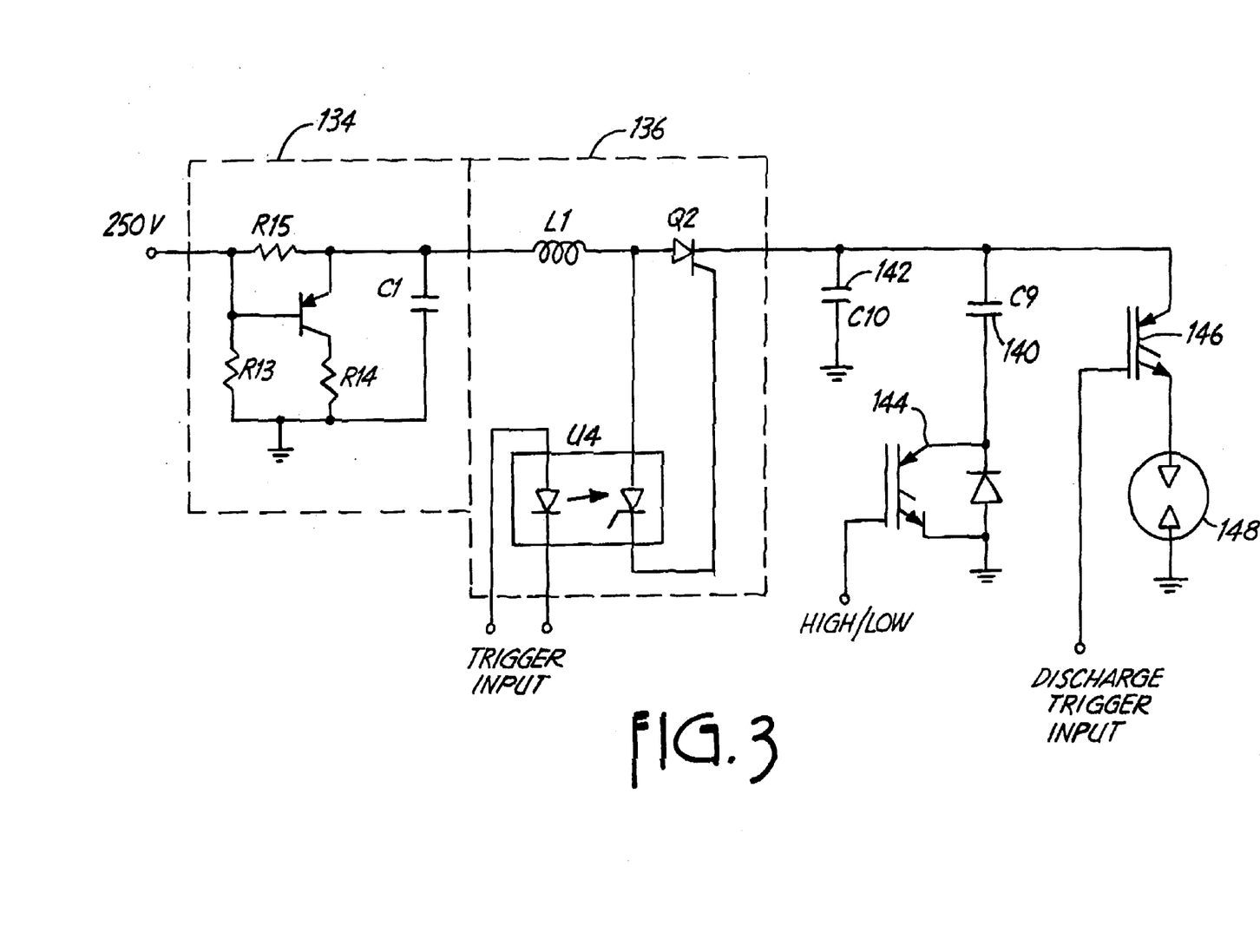
FIG. 3 is a simplified schematic diagram of a flashlamp discharge circuit in accordance with an embodiment of the present invention.

A flashlamp discharge circuit in accordance with an embodiment of the invention is illustrated in FIG. 3. An external power supply provides 250 V to charge a reservoir capacitor 136. Components Q7 and R13–R15 form a fast bleeder circuit 134. This bleeder circuit is used to discharge the +250 VDC to facilitate repair and handling of the circuit by reducing the possibility of electric shock.

In contrast, typical discharge circuits use an unswitched parallel resistor to discharge the reservoir capacitor. If $\tau$ is the time constant of the discharge, C is the capacitance, V is the voltage, and $E=CV^2/2$ is the energy stored by the capacitor, then the power dissipation in the bleeder resistor is $2E/\tau$. If the capacitor in this prior art circuit were $220\,\mu F$, then E=6.9 joules. If $\tau$ is set at five seconds, for a reasonably fast discharge, then the dissipation in the bleeder circuit is 2.75 watts, which is an excessive amount of waste heat. On the other hand, discharge circuits in accordance with embodiments of the present invention overcome this problem by monitoring the power-supply current through resistor R15. If the external supply is delivering power to the circuit, transistor Q7 is reverse-biased, and the dissipation is minimal. If the external supply is turned off, resistor R13 turns on Q7, which then discharges C1 quickly through resistor R14. In the preferred embodiment, $\tau$ is less than five seconds. Resistor R14 must still be rated for a peak dissipation of 3 watts, for survival under gross faults. However, during normal operation, R14 dissipates such a power level only during the brief discharge period when the power supply is turned off.

The reservoir circuit includes inductor L1, SCR Q2 and opto-coupled SCR U4. When U4 receives a pulse from the Trigger Input, its SCR is triggered, which in turn triggers SCR Q2. Current flows through L1 and Q2, charging discharge capacitor C10 (and possibly C9, as will be described later). During this time, L1 and C10 form a high-Q resonant circuit, which produces a lightly-damped sinusoid. This sinusoid has negative peaks at 0 V and positive peaks at +500 V. However, the circuit rings for only half a cycle, since when the voltage across C10 begins its downswing, the current across Q2 is reversed and it goes out of conduction, leaving approximately +450 volts across C10.

After C10 is charged, a pulse is applied on the "Discharge Trigger" line to the gate of insulated gate bipolar transistor (IGBT) device 146, which in turn discharges C10 and possibly C9 as well, through flashlamp 148. The use of IGBT devices in the discharge path increases the operating lifetime of the flashlamp circuit, since undesirable inductors are obviated. Suitable IGBT devices are available from International Rectifier, of El Segundo Calif., as part number IRG4PC50F.

Depending on the application, IGBT 146 may have to be implemented using a plurality of these devices in parallel. However, even such a parallel combination is practical because the low duty cycle of the discharge makes heat sinking unnecessary. Even when there is a plurality of IGBTs, the discharge circuit Q9-D12 is able to satisfactorily handle the current with a single diode.

It is important to note that the Trigger Input signal and Discharge Trigger signal must not overlap in time or else the capacitor C1 will charge through flashlamp 184, damaging the entire circuit. (Interlock circuitry to prevent this problem is described by Herrick.)

Discharge circuits in accordance with some embodiments of the present invention also allow a plurality of discharge energies by using IGBT Q9 and diode D12. For a low-energy discharge, the gate of Q9 is held low, which turns it off. Thus, the node shared between C9 and D12 closely follows the voltage on C10. Since this voltage remains positive throughout the discharge cycle, D12 never becomes forward biased, and C9 is effectively out of the circuit. However, if the gate of Q9 is held high, Q9 turns on and thus holds the bottom of C9 at ground during the charging cycle. During the discharge, the current levels in the preferred embodiment are several hundred amperes, which is beyond the current handling capability of Q9. However, the discharge turns D12 on, and D12 is rated for the discharge current. Thus, during the entire cycle, the bottom of C9 remains near ground and C9 is effectively in the discharge circuit.

Although the present invention has been described with reference to preferred embodiments, workers skilled in the art will recognize that changes may be made in form and detail without departing from the spirit and scope of the invention. For example, it is feasible to use the invention in areas other than in phase profilometry, such as the area of high speed photography or the like.

What is claimed is:

1. A flashlamp circuit comprising:
    a flashlamp;
    a charge reservoir receiving a first voltage and accumulating charge based thereon; and
    a resonator coupled to the charge reservoir and a plurality of discharge capacitors to provide a second voltage to the plurality of discharge capacitors that is greater than the first voltage, where discharge energy is passed from at least one discharge capacitor to the flashlamp through a discharge bank without passing through any inductive elements.

2. The circuit of claim 1 further comprising a switch disposed between at least one of the discharge capacitors and a ground to selectively charge the at least one discharge capacitor based upon an input to the switch.

3. The circuit of claim 1 wherein the discharge bank comprises a plurality of Insulated Gate Bipolar Transistors.

4. The circuit of claim 3, wherein the plurality of Insulated Gate Bipolar Transistors includes at least four Insulated Gate Bipolar Transistors.

5. The circuit of claim 1, wherein the plurality of discharge capacitors is a pair of discharge capacitors and wherein one of the discharge capacitors is coupled to the switch for selective charging based upon a desired discharge energy.

6. The circuit of claim 1, and further comprising a bleeder circuit coupled to ground and interposed between a power supply and the reservoir, wherein the bleeder circuit does not couple the reservoir to ground during operation, but selectively bleeds current to ground upon system shutdown.

7. The circuit of claim 6, wherein the bleeder circuit is adapted to discharge the reservoir within about 5 seconds after system shutdown.

8. The circuit of claim 6, wherein the bleeder circuit includes a transistor that is biased in a first direction during normal operation, and an opposite direction upon system shutdown.

9. The circuit of claim 1, and further comprising a discharge interlock.

10. The circuit of claim 1, and further comprising a resonant-charging interlock.

11. The circuit of claim 2, wherein the switch includes an Insulated Gate Bipolar Transistor.

12. The circuit of claim 1, wherein the flashlamp is triggered a plurality of times, and wherein the interval between at least two of the times is less than or equal to about 1 millisecond.

13. The circuit of claim 12, wherein the flashlamp is triggered three times, and wherein the interval between the first and second instances, and second and third instances is less than or equal to about 1 millisecond.

14. A flashlamp circuit comprising:

a flashlamp;

a charge reservoir receiving a first voltage and accumulating charge based thereon;

a resonator coupled to the charge reservoir and a plurality of discharge capacitors to provide a second voltage to the plurality of discharge capacitors that is greater than the first voltage;

a switch disposed between at least one of the discharge capacitors and a ground to selectively charge the at least one discharge capacitor based upon an input to the switch; and wherein discharge energy is passed from at least one discharge capacitor to the flashlamp through a discharge bank without passing through any inductive elements.

* * * * *

UNITED STATES PATENT AND TRADEMARK OFFICE
CERTIFICATE OF CORRECTION

PATENT NO. : 6,593,705 B1
DATED : July 15, 2003
INVENTOR(S) : Rudd et al.

It is certified that error appears in the above-identified patent and that said Letters Patent is hereby corrected as shown below:

<u>Title page,</u>
Item [56], OTHER PUBLICATIONS, " Accurate Machine Vision s the 'Telecentric Advantage' " should be -- "Accurate Machine vision is the 'Telecentric Advantage ' " --

Signed and Sealed this

Twenty-fifth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,593,705 B1
DATED : July 15, 2003
INVENTOR(S) : Rudd et al.

It is certified that error appears in the above-identified patent and that said Letters Patent is hereby corrected as shown below:

Title page,
Item [56], References Cited, U.S. PATENT DOCUMENTS, insert -- 5,455,870 --

Signed and Sealed this

Twenty-fifth Day of January, 2005

JON W. DUDAS
*Director of the United States Patent and Trademark Office*